United States Patent [19]

Chapman et al.

[11] Patent Number: 5,087,589

[45] Date of Patent: * Feb. 11, 1992

[54] SELECTIVELY PROGRAMMABLE INTERCONNECTIONS IN MULTILAYER INTEGRATED CIRCUITS

[75] Inventors: Glenn H. Chapman, Bedford; Terry O. Herndon, Carlisle, both of Mass.

[73] Assignee: Massachusetts Institute of Technology, Cambridge, Mass.

[*] Notice: The portion of the term of this patent subsequent to Jun. 27, 2006 has been disclaimed.

[21] Appl. No.: 371,587

[22] Filed: Jun. 26, 1989

Related U.S. Application Data

[63] Continuation-in-part of Ser. No. 194,720, May 23, 1988, Pat. No. 4,843,034, which is a continuation-in-part of Ser. No. 61,885, Jun. 12, 1987, abandoned.

[51] Int. Cl.$^5$ .............................................. H01L 21/44
[52] U.S. Cl. ..................................... 437/195; 437/189 437/199; 437/196; 437/24; 437/173
[58] Field of Search ................. 437/189, 199, 24, 173, 437/195, 196

[56] References Cited

U.S. PATENT DOCUMENTS

| | | | |
|---|---|---|---|
| 4,137,100 | 1/1979 | Zaleckas | 437/31 |
| 4,662,063 | 5/1987 | Collins et al. | 437/172 |
| 4,810,663 | 3/1989 | Raffel et al. | 437/46 |
| 4,840,923 | 7/1989 | Flagello et al. | 437/203 |
| 4,843,034 | 6/1989 | Herndon et al. | 437/189 |
| 4,907,066 | 3/1990 | Thomas et al. | 357/54 |

Primary Examiner—Brian E. Hearn
Assistant Examiner—Trung Dang
Attorney, Agent, or Firm—Thomas J. Engellenner

[57] ABSTRACT

A method of fabricating programmable interlayer conductive links in a multilayer integrated circuit structure, comprising the steps of forming elements of either a conductive or semiconductive material as a lower layer, depositing an insulative layer on top of the lower layer elements, implanting ions into one or more link regions of the insulative layer, forming at least one upper conductor over the implanted regions and selectively applying sufficient energy to at least one of the implanted regions of the integrated circuit structure to render the selected link region conductive. The invention also embraces customized integrated circuit structures with interlayer conductive paths made in accordance with this method.

25 Claims, 5 Drawing Sheets

ION IMPLANTATION

METAL DEPOSITION

MASK REMOVAL

DIFFUSION

*INSULATOR DEPOSITION*

*MASK DEPOSITION & DEFINITION*

*ION IMPLANTATION*

*MASK REMOVAL*

METAL DEPOSITION

DIFFUSION

INSULATOR DEPOSITION

MASK DEPOSITION & DEFINITION

SELECTIVELY PROGRAMMABLE INTERCONNECTIONS IN MULTILAYER INTEGRATED CIRCUITS

The United States Government has rights in this invention pursuant to Contract No. F19628-85-C-0002 awarded by the Department of the Air Force.

REFERENCE TO RELATED APPLICATIONS

This application is a continuation-in-part of U.S. patent application Ser. No. 194,720 filed May 23, 1988, now U.S. Pat. No. 4,843,034, which is a continuation-in-part of U.S. patent application Ser. No. 061,885 filed Jun. 12, 1987 (now abandoned).

BACKGROUND OF THE INVENTION

The technical field of this invention is solid state integrated circuit fabrication and, more particularly, methods and systems for fabricating programmable interlayer conductive paths in integrated circuits.

The rapid development of large scale integrated circuitry during the past two decades has been the result of advances in both circuit design and fabrication technology, which have allowed more circuits to be implemented on a chip. A single chip can now contain hundreds of thousands of transistors, a considerable increase over the few thousand on a chip as recently as the early 1970's.

Solid state integrated circuits are typically formed from wafers, which include a plurality of layers of conductors, active electronic devices, and passive insulators on, or within, a single semiconductor crystal. After the wafer is fabricated, it can be sliced into individual chips capable of performing discrete electronic tasks.

In this technology, an interlayer conductive path through intervening insulation between conductors in the integrated circuit is called a "via". A similar path through such insulation between an overlaying conductor and a semiconductor region is called a "contact cut" (or, more descriptively, a "contact connection"). Typical wafers can have millions of such conductive paths and even moderate scale chips, containing, for example, 4,000 transistors, can have as many as 1,000 vias and over 8,000 contact connections.

Design limitations imposed by these interlayer electrical connections play an important role in present and future semiconductor circuit packing density. Very large scale integrated circuits ("VLSI") will require improved multi-level interconnects to attain performance and density goals. In theory, a three-level-metal integrated circuit permits approximately a doubling of the packing density over a two-level-metal device of similar materials and size. Device packing density, however, does not rise linearly with the increase in number of interconnected layers, but is limited by topographical area of a wafer which must be devoted to providing vias and contact cuts.

A conventional approach to constructing vias is evaporative or sputter deposition of metal into vertical directed holes. A hole is etched in an insulative layer deposited on a lower conductor, both of which overlay a substrate. A metal (which will form the overlying upper conductor) is then deposited to cover the inside and bottom of the hole and thereby establishing a conductive via through the insulative layer between the lower and upper conductors. A contact connection is fabricated in a similar way by etching a hole in which metal is deposited to provide electrical connection between an upper conductor and an underlying semiconductor region. (In practice, after the holes are etched, metal is deposited over the entire surface of the wafer and then masked and etched away selectively to leave conductive metal lines which pass over the metal-filled vias and contact cuts).

Difficulties are often encountered in preparing a clean hole and in depositing the metal for the interlayer conductive path. For example, when the metal is deposited into a hole, the metal tends to build up and form a marginal step at the top rim of the hole, before sufficient metal is deposited to reach the bottom of the hole.

Additionally, at the center of the via, a crater is formed as the metal initially conforms to the sidewalls and bottom of the hole. The result is a very irregular top surface of the via. This condition can lead to thinning of the upper conductor, as well as non-planar deposition of subsequent layers, in the region immediately above the via.

Moreover, the planar irregularities can cause distortions in photo-resists and subsequent layers of integrated circuitry deposited above the via. When a photo-resist is deposited above a via (or an intermediate non-planar surface such as a metal conductor), the exposing light during development can be reflected by the underlying contour and lead to the narrowing or notching of the photoresist or subsequent deposits, thereby imposing limits on the resolution of device and conductor structures in these layers.

The problems associated with step coverage over vias has led to VLSI design rules which prohibit the deposition of other metal conductors directly above any via. The process of forming vias by etching holes also requires a widening of the interconnected conductors at least in the area of each via to ensure that each hole is surrounded by sufficient metal to provide tolerance in the vertical registration of conductors.

For example, a two micron wide conductor is required for a one micron wide via, and, similarly, a one micron wide conductor is needed for a ½ micron wide via to assure sufficient overlap.

At very small dimensions, it becomes increasingly difficult to ensure continuity and integrity of vias and contact cuts. One reason for this is the difficulty at such dimensions to clean out the bottom of the hole H of all insulating material prior to metal deposition. Another is the difficulty of depositing metal into such small holes.

The problem of getting metal down into the via or contact cut can be reduced by forming the hole with sloping sides. However, a vertical conductive path with sloping sides obviously takes up more space on the wafer and, as the need for smaller and smaller device structures continues, the less attractive this solution becomes. It has been estimated that with conventional via design, it will be difficult to reduce the area occupied by the via below 2×2 microns. Furthermore, steep sloping sides can make it difficult to deposit a sufficiently thick uniform conductive film on the sides of the holes.

An alternative process for filling vias is to fill the holes by chemical vapor deposition ("CVD") rather than by the evaporative or sputter deposition of metal over the entire surface of the wafer. In CVD processes it is possible to selectively grow metal layers over only those regions of the wafer where metal is already exposed. In this manner a via can be filled up from the bottom by selective deposition of a metal such as tungsten. However, even the most promising of the CVD processes are difficult to control, particularly when filling contact cuts, and, in any event, a hole still must be cut and then fully cleaned out before the metal can be deposited.

Another approach involves the use of lasers to convert an insulator into a conductor and thereby forming the interlayer path. Commonly owned U.S. Pat. Nos. 4,585,490 and 4,810,663 disclose a technique in which a "link insulator" is deposited where vias are desired. When a metal layer deposited above the link insulator is exposed to a high power laser having a pulse on the order of about 1 millisecond, a conductive path can be formed by melting the top metal layer and alloying at least a portion of it with the link insulator material. However, the deposition of link insulators involves materials such as amorphous silicon and silicon-rich silicon nitride which are not extensively used in the semiconductor industry.

The requirements associated with the formation of interlayer conductive paths by conventional techniques place limitations on the circuitry and affect circuit density. Consequently, it is an object of the invention to provide methods and systems for fabrication of integrated circuits with simpler design requirements, higher packing densities and more planar surfaces than those resulting from conventional interlayer connection technology.

In the above-referenced, commonly-owned patent applications, U.S. Ser. Nos. 194,720 and 061,885, methods and systems are disclosed for fabricating interlayer conductive paths by implanting ions into selected regions of normally insulative layers to change the composition and/or structure of the insulation in the selected regions. An upper conductive layer can then be deposited over such implantation regions and the entire structure sintered at a temperature between approximately 330° C. and 500° C. As a result of the low temperature sintering, atoms from the upper conductive layer or, where two conductive layers are being interconnected, from the upper and lower conductive layers, are diffused or alloyed into the implant region to form a low resistance, conductive path between the upper conductor and the underlying element, the path having a bulk resistivity of about $10^{-4}$ ohm-cm, or less.

The approach of U.S. Ser. Nos. 194,720 and 061,885 takes advantage of sintering steps which are already employed in semiconductor device fabrication for other purposes. Wafers are typically sintered to reduce the adverse effects of the various other processing steps during their fabrication and to improve electrical connections between conductors and the electronic devices throughout the wafer.

However, the sintering process is by its nature non-specific and ill-suited to the fabrication of variable or programmable circuits. The ability to selectively alter circuit paths in previously fabricated devices is very important for the production of user-customizable integrated circuits. The use of programmable vias, called links, enables the creation of such unique circuits.

There exists a need for better fabrication techniques for interlayer conductive paths, particularly paths which can be selectively activated or programmed to form customized gate arrays and other programmed devices.

SUMMARY OF THE INVENTION

Techniques for programming links in multilayered integrated circuits to customize gate arrays and other programmable devices are disclosed. Local application of energy, such as radiant (e.g., laser) energy or electrical stimulation, can be used to promote diffusion and thereby selectively create conductive paths in regions of an insulative material which has been previously subjected to ion implantation to form diffusion pathways. The selective radiation or electrical stimulation induces localized diffusion to create vertical conductive paths. The term "diffusion" is used herein to embrace the migration of atoms and the alloying of materials, generally.

In accordance with the invention, customized interlayer conductive paths can be produced by first depositing an insulator, either by chemical vapor deposition with or without plasma enhancement, or spin-on coating over continuous areas of the wafer on top of an already formed lower conductive layer which is to be connected to an upper conductive layer. After the insulative layer has been applied, those regions in the insulative layer through which conductive paths are desired are subjected to ion implantation. This implant step has the effect of changing the composition and/or structure of the insulation in the selected regions. The upper conductive layer is then deposited, patterned and etched into discrete conductor pathways.

In one embodiment, the application of a voltage between the upper and lower conductive layers lying opposite each other on either side of ion-implanted insulator region produces a low resistance, conductive path or an antifuse between the upper and lower conductors discretely at the point of the implanted region. The voltage required to effect this programmable link is inversely proportional to the amount of implanted ions and can be varied from a low value (3 volts) to the voltage that would normally be required to breakdown the unimplanted insulative layer (150 volts or more).

The amount of silicon implantation needed for voltage programmable links is less than the implant needed for the 425° C. sinter-activated planar vias. Thus, it is possible to employ two levels of silicon implantation which will permit planar vias and voltage programmable links to be made together on the same I.C. wafer. For example, implantation through one mask with a high silicon dose would produce the sinterable via sites with no implant being done at the voltage programmable link sites. Then, the via mask would be replaced with a voltage programmable link mask, and a lighter silicon implant would be carried out with no implant being done at the via sites. Alternatively, implantation can be done through one mask at a moderation implantation dose at both the via and programmable link sites. Then this mask can be replaced by a "via only" mask and an additional implant would significantly raise the ion dose at the via sites. In either event, the two masking-implantation sequences can be carried out using standard lithographic, etching and implantation techniques. This would achieve high-density interconnects through use of planar vias and also make possible high-density, low impedance interconnection of logic and memory circuits by voltage programming links.

In a second embodiment, the application of directed electromagnetic radiation, such as by a laser beam or the like can effect a resistive connection between the upper and lower conductors through the implanted region of the insulator. When an argon laser beam, shuttered to make 20 μs to 50 ms wide pulses and focused to a spot size between 1.3 and 4.2 μm, is applied to the metal/implanted, insulator/metal structure, ohmic connections are made at power levels greater than 1.5 watts. Less than 20 ohms resistance was observed in silicon oxide implanted with silicon in excess of $1.0 \times 10^{17}/cm^2$ implant doses.

Again, the laser activated diffusion sites can also be controlled independently of sinter-activated vias. The laser activated connections in silicon oxide occur with silicon implants as low as $4.0 \times 10^{17}/cm^2$, while the 425° C. sintered planar via connections require implants in excess of $1.0 \times 10^{18}/cm^2$. Thus, although similar in behavior, implanted laser links can also be activated under conditions distinct and separate from planar vias. This means that in a circuit containing both amounts of implanted silicon, normal vertical connections can be made with planar vias by sintering, with circuit programming or structuring being done by laser activation of discrete interconnect crossings. Thus, the implantation technique can produce planar vias, as well as laser programmable interconnection links, all with the same equipment on the same I.C. wafer with one additional masking step. The planar via permits high-density multilevel interconnects, and the laser-formed additive interconnection permits discrete programming of high-density, low impedance logic and memory device interconnects.

A wide range of insulative materials can be rendered selectively conductive in this manner, including organic insulators, such as polyimides ("PI"), and inorganic insulators, such as metal oxides or semiconductor oxides, nitrides or carbides. One preferred insulator which can be processed according to the present invention to yield high resolution interlayer conductive paths is silicon dioxide, a material which is already used extensively in the industry. Other insulators include silicon nitride, and other inorganic glassy insulators generally, such as silicon carbide, aluminum oxides, diamond-structure carbon and the like.

Silicon dioxide is particularly preferred because it is already in widespread use in integrated circuit fabrication as an insulator. It is generally accepted as a choice insulator because of its low dielectric constant and because it can be epitaxially grown directly from a silicon substrate source. In addition to epitaxial growth (e.g., by exposing a silicon wafer to moisture or an oxygen-containing ambient at about 1000° C. to about 1200° C.), silicon dioxide can be deposited by sputter deposition, spin-on glass deposition, plasma deposition, CVD processes, etc., in order to obtain an insulative layer useful in constructing interlayer conductive paths according to the present invention.

Alternatively, other inorganic insulative glasses, such as silicon nitride, can be employed. When silicon nitride is used as the insulator through which interlayer conductive paths are to be formed according to the present invention, it is preferably deposited as a silicon-rich composition containing up to twice as much silicon as the normal ($Si_3N_4$) stoichometric formula. Thus, preferred silicon nitride compositions can be expressed as $Si_xN_y$, where the ratio of x to y falls within the range of approximately 0.75 to 1.7, and is more preferably approximately 1.6. The silicon-rich $Si_xN_y$ can be deposited, for example, by a plasma-enhanced chemical vapor deposition ("PECVD") technique or related methods. In such deposition processes, the silicon content of the $Si_xN_y$ can be measured by changes in the its index of refraction. For further information concerning the deposition of silicon nitride, see "Low Resistance Programmable Connections Through Plasma Deposited Silicon Nitride", by J. A. Burns, G. H. Chapman, B. L. Emerson; Electrochemical Society Extended Abstracts. Vol. 86-2, pg. 481 (1986) herein incorporated by reference.

A wide variety of implanted ions can be employed in the present invention to prepare the interlayer conductive paths. When silicon-based insulators are used, such as silicon dioxide or silicon nitride, it is typically preferable to use silicon ions in the implantation step as well. More generally, however, the implant ions can include ions of silicon, germanium, carbon, boron, arsenic, beryllium, phosphorus, titanium, molybdenum, aluminum and gold, depending on the particular application and materials.

The preferred implantation energy and fluence of such ions will be dependent on a number of factors, including the size of the path, the type and thickness of the insulator, and the underlying structures or substrate. Typically, the implantation energy will vary from about 10 to about 500 KeV. For some applications, such as when forming conductive paths through thick films, even higher implantation energies can be employed. Typically the implantation step can be carried out at doses ranging from about $1.0 \times 10^{16}/cm^2$ to about $1.0 \times 10^{19}/cm^2$.

Various conductor materials can be employed to provide the (upper and/or lower) conductive lines which are joined according to the present invention. Such conductor materials, including aluminum and aluminum alloys, such as Al-Si. Aluminum-based conductors are typically preferred, at least when the insulator layer is a silicon-based insulator (e.g., $SiO_2$ or SiN), because of the special affinity of aluminum for silicon and its ability to readily diffuse into the implant regions during sintering. Other conductor materials useful in the practice of the present invention include copper alloys, aluminum-titanium alloys, aluminum-copper-chromium alloys (or sandwiches) and the like. More generally, the conductive materials can include materials doped to conductive state, as well as naturally conductive materials, so long as the materials exhibit a suitably low initial resistivity (i.e., about $10^{-3}$ ohm-cm or less) and are capable of selective migration/diffusion into the implant region during activation.

Thus, present invention offers alternative techniques for fabricating interlayer conductive paths by converting an insulator to a conductor at selected sites, thereby forming an integral conductive path, in contrast to the conventional technique of removing the insulator followed by deposition of a conductor. This novel technique results in a substantially planar surface above the interlayer conductive path, and a path geometry with substantially vertical sides which can be created with high resolution.

The invention will be described below in connection with certain illustrated embodiments; however, it should be clear that various additions, subtractions and modifications can be made by those skilled in the art without departing from the spirit or scope of the claims. For example, although the invention is exemplified by vertical interlayer conductive paths, it should be clear that the techniques disclosed herein can also be used to form horizontal conductive bridges across and/or through otherwise insulative materials, as part of an overall mass fabrication process or in order to repair or customize individual integrated circuits.

BRIEF DESCRIPTION OF THE DRAWINGS

The foregoing and other objects of this invention, the various aspects and features thereof, as well as the invention itself, may be more fully understood from the following description, when read together with the accompanying drawings, in which.

DETAILED DESCRIPTION

FIGS. 1A through 1F, show a representative integrated circuit structure IC at various stages of fabrication in accordance with a preferred embodiment of the invention.

Figure 1A:
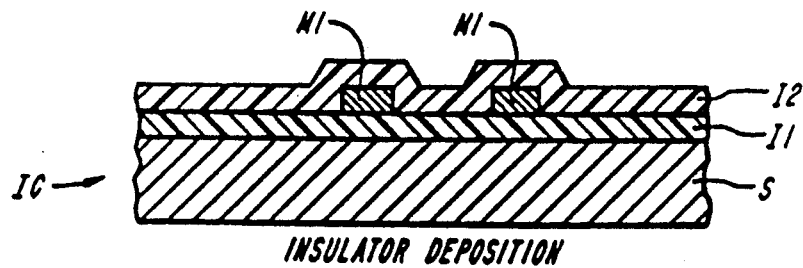
FIGS. 1A–1F are sectional views of an integrated circuit structure showing vias at various stages of fabrication in accordance with the invention.

Referring to FIG. 1A, after a first insulative layer I1 is deposited over a substrate S, by oxidation, sputtering, chemical vapor deposition or other process well-known to those skilled in the art, a pattern of first metal conductive paths or conductors M1 is formed extending generally horizontally. This first conductive layer can be deposited, for example, by sputtering metal to a thickness of approximately 0.5 microns to 1.0 microns on the first insulative layer and then etching a pattern of horizontal metal lines in the metal layer. A second insulative layer I2 then is deposited over the first conductors M1. The insulative layer I2 can be a organic insulator, such as a polyimide, or an inorganic insulator, such as a metallic oxide or silicon-based glass. Insulative silicon compounds, such as silicon dioxide, silicon nitride, and silicon carbide, are particularly useful. The deposition of the insulative layer I2 can be achieved by known techniques, such as plasma deposition, and can result in uniform coverage of approximately 0.2 to 1.0 microns, preferably approximately 0.5 microns in thickness over a large, continuous area of the wafer, as shown.

Figure 1B:
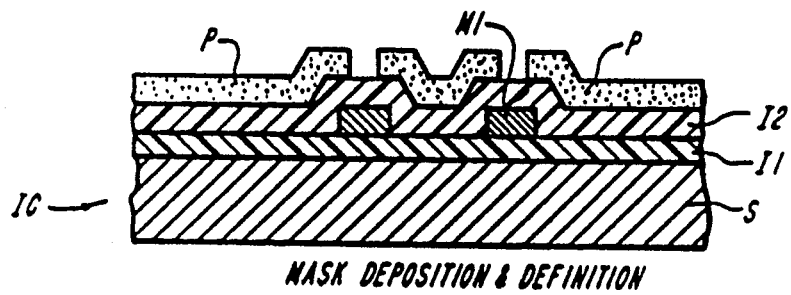

FIG. 1B illustrates the deposition and definition of a mask P preferably of a metallic material over the insulative layer I2. The mask can be patterned by known photolithographic techniques, such as high resolution, step-on-wafer photolithography or, alternatively, by electron beam or x-ray lithography.

After exposure and development, portions of the mask are etched away to expose the I2 layer only in the areas of the voltage/laser programmable link sites. This can be achieved, for example, through known wet chemical processes, either isotropic or anisotropic. For dense circuit packing and small device size where high-aspect-ratio etching is desirable, dry plasma etching, reactive ion etching or ion milling typically will be preferred.

After definition of the mask P, the structure is ready for ion implantation.

Figure 1C:
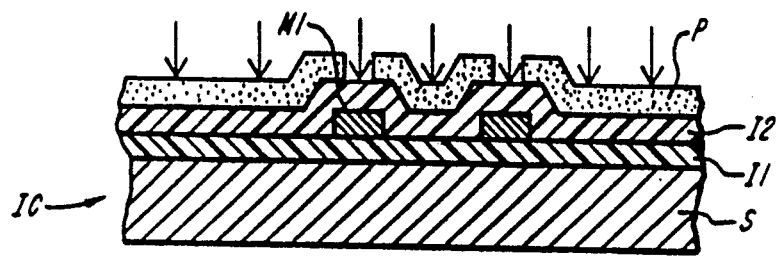

FIG. 1C illustrates the ion implanting step in which the exposed surface of the mask P is subjected to ions, preferably of silicon when the insulative layer I2 is an insulative silicon compound, such as $SiO_2$ or $SiN$. This effectively changes the composition and/or structure of the insulative layer in the regions exposed by the openings in the mask.

As is well known in the art, the amount of the implant, its concentration, and its distribution profile, can be all be controlled by varying the beam current, voltage and time of exposure. The implanted atoms can be selected from the group consisting of silicon, germanium, carbon, boron, arsenic, beryllium, phosphorous, titanium, molybdenum, aluminum and gold.

To attain the desired uniform distribution profile of implanted ions within the interlayer Pathway, a plurality of different beam energies can be used. For example, several implants at varying acceleration voltages can be performed to distribute ions throughout the thickness of the implantation region in order to have a more uniform distribution. Alternatively, if only one level is used, the energy can be selected to provide a Gaussian distribution of implanted ions centered in the middle of the region.

The ion implantation step changes the composition and structure of the insulative layer, and is believed also to have the effect of displacing oxygen, nitrogen, or carbon (depending upon the composition of the insulative layer) so as to promote the migration and alloying of metal from the conductive layer(s) into the implanted region during the sintering step. The implantation also is believed to have a physical effect of disrupting the crystal lattice, which may also facilitate diffusion of the metal. It results in a composite material in the implantation region essentially consisting of the disrupted insulator and implanted ions.

As an alternative to the masking step illustrated in FIG. 1B, maskless ion implantation can be utilized with certain ion sources. For example, silicon or beryllium ions can be implanted into 0.2 to 2.0 micron areas without a mask using a focussed ion beam implanter manufactured by Ion Beam Systems of Beverly, Mass.

Figure 1D:
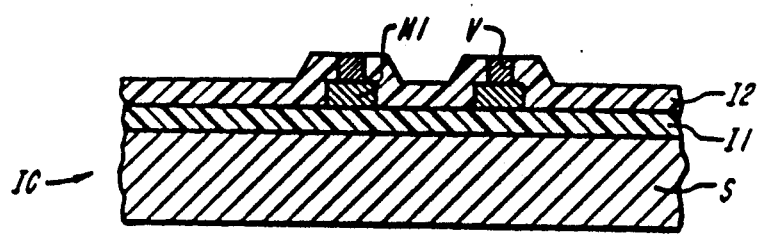

If a mask is utilized, it typically is removed at the completion of the ion implantation step. The integrated circuit structure resulting from the implantation is shown in FIG. 1D. The implanted regions are cross-hatched and located immediately above the lower conductors M1 to be connected.

Figure 1E:
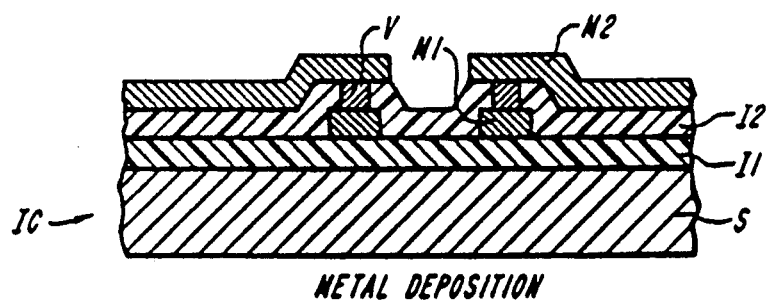

FIG. 1E illustrates the deposition of a second layer of metal conductor M2 directly on the second insulative layer I2, which proceeds in a fashion similar to that described above in connection with the first conductor layer M1. Conductor M2 is disposed directly over the implanted region which will form programmable link V.

Figure 1F:
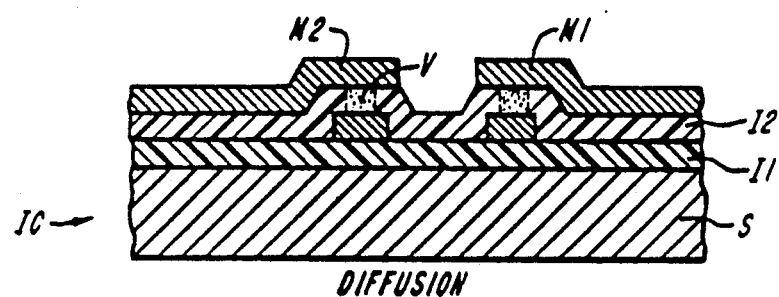

FIG. 1F illustrates the activation of the resulting structure which results in the formation of conductive links integrally disposed within the insulative material of layer I2. The activation can be accomplished by a variety of conventional techniques. For example, selected regions of the wafer can be activated by application of an electrical voltage or laser radiation.

Thus, the effect of the selectively applied energy is to diffuse the material of conductors M1 and M2 into and through the implant regions, thereby forming a composite conductive material. The resulting vias will have a bulk resistance on the order of about 1 ohm, well within the requirements of multi-layer integrated circuits, while the unimplanted, silicon dioxide, silicon nitride or polyimide insulative layer has a resistivity of approximately $10^{14}$ ohm-cm.

FIGS. 2A through 2F illustrate the fabrication steps in making contact connections C in accordance with the invention between an underlying element in the form of a semiconductor region of transistor T (having a source $S_o$, drain D and gate G), as well as a polysilicon layer $P_o$ disposed above the gate oxide. The steps are similar to those described above with reference to FIG's 1A through 1F and, therefore, require only a brief narrative. Analogous features bear the same reference letters.

Figure 2A:
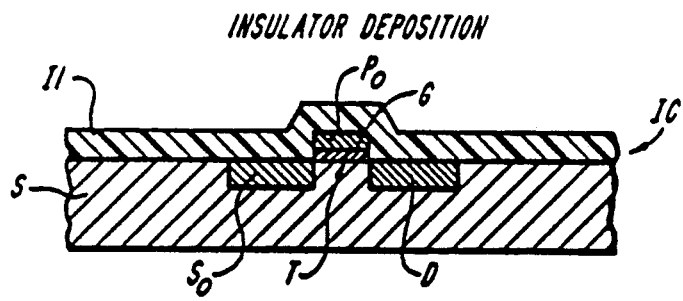
FIGS. 2A–2F are sectional views of an integrated circuit structure showing contact connections between a conductor and a semiconductor region in accordance with the invention.

In FIG. 2A, a first insulative layer I1 is deposited above the previously formed semiconductor regions formed on the substrate S, as well as above the polysilicon layer $P_o$.

Figure 2B:
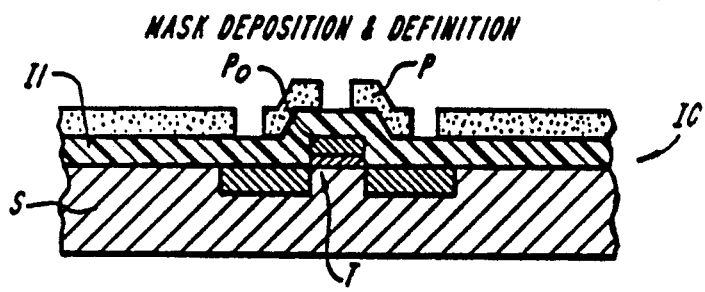

Subsequently, in FIG. 2B, a mask P is deposited and defined, having openings over the selected regions for the contact connections C.

Figure 2C:
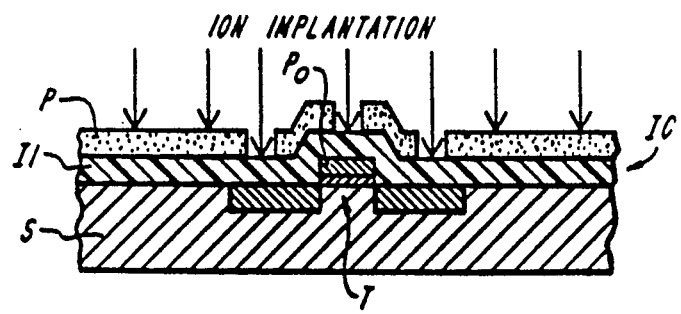

In FIG. 2C, the selected regions of the integrated circuit structure are subjected to ion implantation.

Figure 2D:
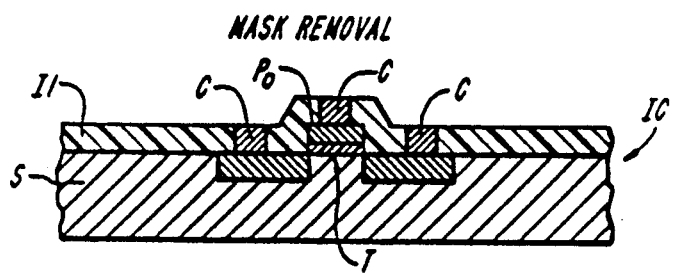

Next, in FIG. 2D, the mask is removed.

Figure 2E:
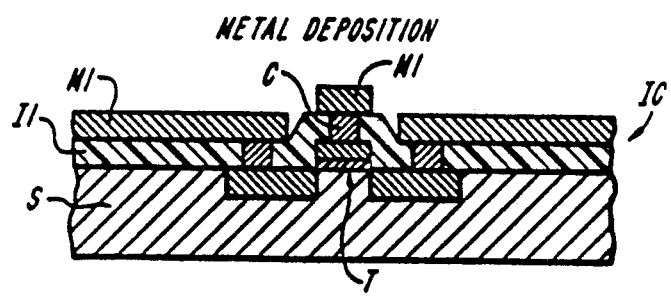

In FIG. 2E, a first metal layer M1 is deposited and defined such that it is superimposed, at least in locations immediately above the implanted regions, over the underlying elements to be connected.

Figure 2F:
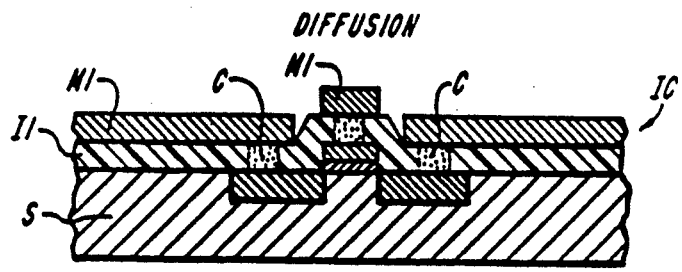

Finally, in FIG. 2F, the selected regions of integrated circuit structure IC are activated by selective application of energy, resulting in the formation of conductive paths through the intervening insulative layer I1, interconnecting the underlying elements with conductive layer M1. This results from the diffusion of the conductive material of the overlying first conductive layer M1 into the implanted region, forming the electrical interconnection with the underlying element.

Thus, the fabrication of contact connections according to the invention is similar to the fabrication of vias as described above.

Figure 3:
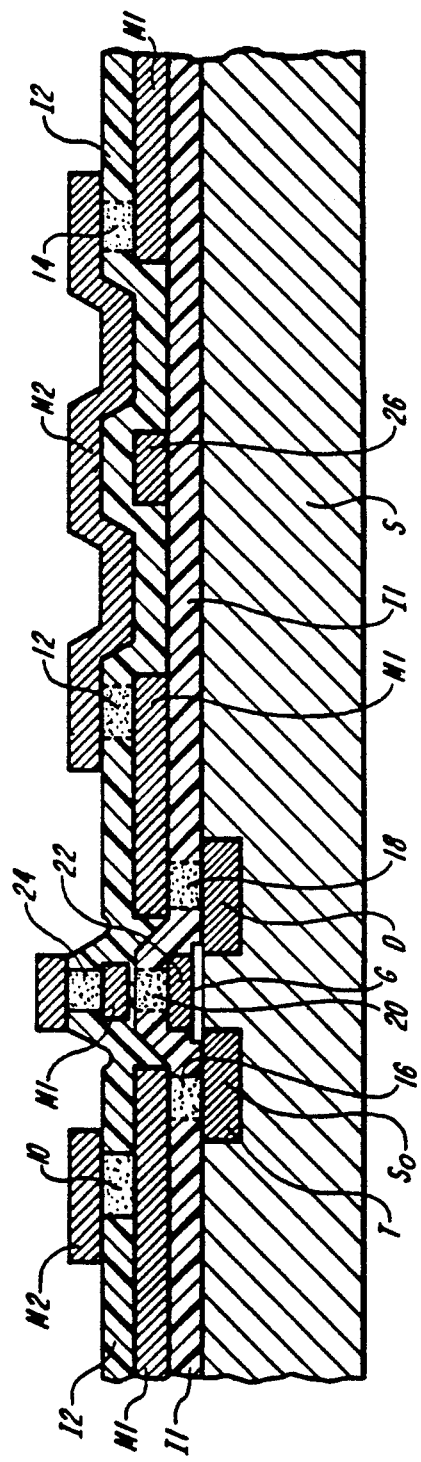
FIG. 3 is a sectional view of an integrated circuit showing a plurality of interlayer conductive paths in accordance with the invention.

An integrated circuit made in accordance with the invention is shown in FIG. 3. The individual horizontal conductive lines (e.g., conductor 26) of the first conductive layer M1 are insulated from the underlying substrate and active devices therein by insulative layer I1. Vertical conductive paths 10, 12, and 14 interconnect the first horizontal conductive layer M1 to a second horizontal conductive layer M2. Similarly, vertical conductive paths 16, 18 interconnect a semiconductor region of the transistor T to the first metal layer M1. Conductive path 20 interconnects a polysilicon layer 22 to the first metal layer M1. Conductive path 24 interconnects the first metal layer M1 to the second metal layer M2 and, importantly, is disposed vertically over the conductive path 20, illustrating that conductive paths in accordance with the invention can be stacked one above another.

The resulting integrated circuit has interlayer conductive paths with substantially planar top surfaces. These vertical paths can have generally cylindrical geometry or can be box-like with a square or rectangular cross-section. Two conductors in different layers can be connected, with the material of both diffusing into the implant region. Alternatively, where a semiconductor is interconnected with an overlying conductor, the material of the overlying conductor can be diffused down into the implant region by electrical or radiant energy stimulation without affecting the underlying solid state device.

Furthermore, interlayer conductive paths made in accordance with the invention can be of equal width to that of the conductors in the link region. For example, a two micron wide conductor can be interconnected with two micron wide path, with no overlap required.

The invention is further illustrated by the following non-limiting examples.

EXAMPLE I

Electrical Programming of Ion Implanted Insulators

A pattern of metal lines was formed upon the surface of a silicon wafer by sputter deposition of a first conductive layer of Al-1%Si-2%Cu about 8000 angstroms in depth, followed by photolithographic masking and plasma etching of the unmasked regions. Insulative layers of silicon dioxide, silicon nitride and polyimide were next deposited by chemical vapor deposition or spin coating onto the surface of the wafer, covering the surface and the pattern of lower metal lines with an insulative layer of about 2500 angstroms in depth.

Figure 4:
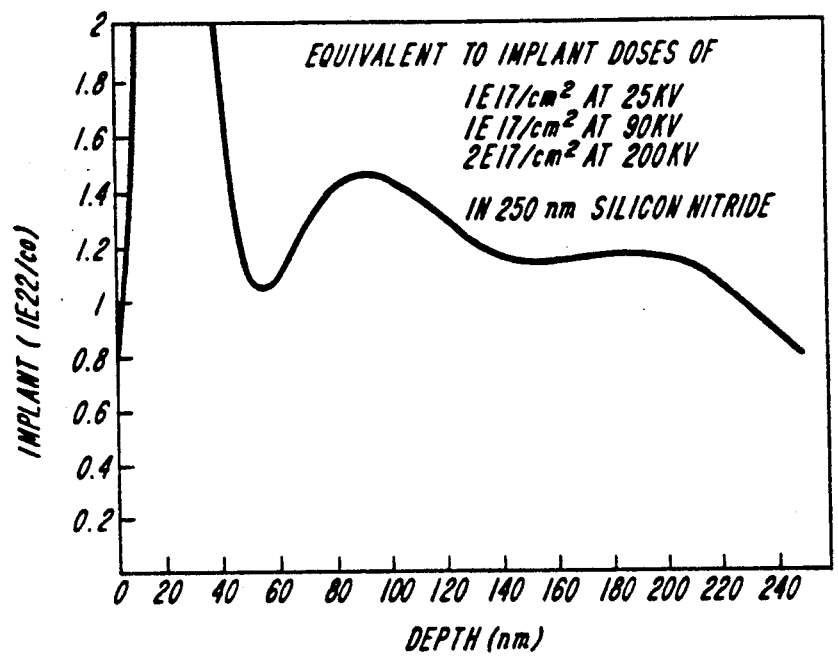
FIG. 4 is a graph illustrating an exemplary ion implantation depth profile in accordance with the invention.

The insulative layers were then masked using standard photolithographic techniques so that only selected spots on the order of about 3 microns by 3 microns overlying the metal lines were exposed. Silicon ions were implanted into these regions of the $SIO_2$ layer using a ion implantation machine (for example, an Extrion 200-20 ion implanter manufactured by Varion, Inc. of Gloucester, Mass. or equivalent). In the region of each programmable link, an implant dose was provided at three levels: $1 \times 10^{17}/cm^2$ at 25 KeV; $1 \times 10^{18}/cm^2$ at 80 KeV; and $2 \times 10^{18}/cm^2$ at 180 KeV. FIG. 4 shows the implant profile for an SiN layer. Similar profiles were obtained for SiO and polyimide by adjusting the insulator thickness, the middle implant voltage and total implant dose.

After implantation, a second metal layer (e.g., again, an Al-Si-Cu alloy) was deposited by a plasma sputtering system (for example, a sputtering machine manufactured by CVC, Inc. of Rochester, N.Y. or equivalent) and then photolithographically patterned and etched to provide a second layer of upper conductive lines traversing the implantation regions.

Selected regions were then chosen for activation by electrical stimulation. A voltage was applied across the implantation sites. Following activation, the implantation sites were found to exhibit excellent conductivity (i.e., a low resistance on the order of 25 ohms or less) and substantially planar surfaces. The interlayer conductive paths were well bonded to the upper and lower conductive metal lines. Analysis of vertical paths and the metal lines revealed solid interdiffusion of silicon into the upper and lower conductors, as well of aluminum into the link region.

Figure 5:
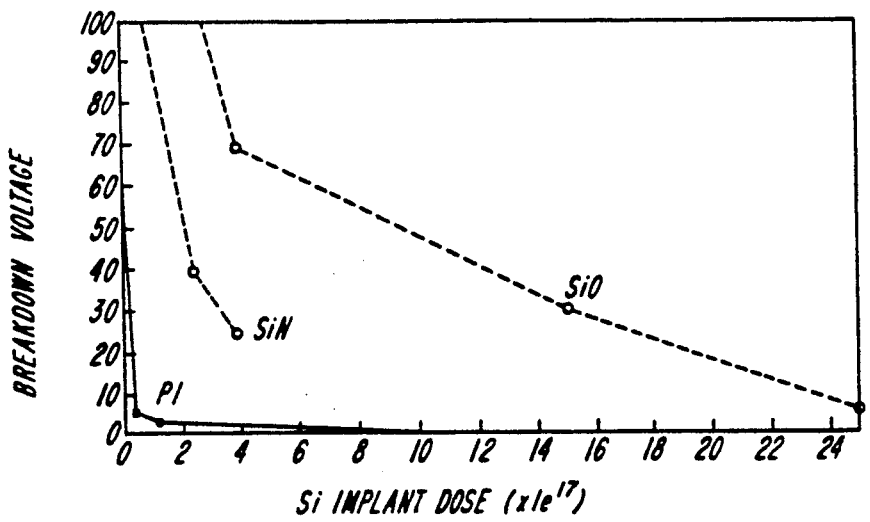
FIG. 5 is a graph illustrating the dielectric breakdown voltage versus ion implantation dose for thin layers of polyimide, silicon nitride and silicon dioxide insulators.

The reduction of breakdown voltage versus Si implant dosage is shown in FIG. 5 for the three insulators. The breakdown voltage of unimplanted insulation was in the range of 130-170 volts. As can be seen, the PI breakdown dropped below 10 V at implant doses in the $1.0 \times 10^{16}$ to $1.0 \times 10^{17}$ range. The SiN breakdown fell to 24 V at $3.0 \times 10^{17}$ Si while the SiO fell to 70 V at that dose, and required $2.5 \times 10^{18}$ Si to achieve breakdown below 10 V. In all cases, the voltage programmable link resistance was less than 25 ohms and in some instances less than 4 ohms (the series resistance of the probes).

Voltage programming was achieved by a current limited pulse whose voltage exceeded the conduction threshold of the implanted insulator by approximately 25%. The pulse provided sufficient Joule heating to form the connection by Al diffusion through or alloying with the insulator. Current limiting was required to prevent overheating the connection during its formation. The connection process was studied with a storage oscilloscope and the time needed to form a connection determined to be less than 2 microseconds. The need to current-limit the pulse was recognized by observing connections form and open as a result of excess heating. The voltage programming technique which appears to be preferable is to apply repeated, short pulses on the unformed link. In one illustrative embodiment, six 70 volt, current limited pulses were applied across the link. The link formed during the sixth pulse as demonstrated by the remaining pulses dropping to a low voltage across the 20 ohm resistance of the link.

EXAMPLE II

Laser Programming of Ion Implanted Insulators

A pattern of metal lines was again formed upon the surface of a silicon wafer by sputter deposition of a first conductive layer of Al-1%Si-2%Cu about 8000 angstroms in depth, followed by photolithographic masking and plasma etching of the unmasked regions. Insulative layers of silicon dioxide, silicon nitride or polyimide were again deposited by chemical vapor deposition or spin coating onto the surface of the wafer, covering the surface and the pattern of horizontal metal lines with an insulative layer of about 3000 angstroms in depth.

The insulative layers were then masked with 7000 angstrom thick AlSi and this metal mask was patterned photolithographically, plasma etched and selectively removed to expose only selected spots overlying the conductive lines. Via patterns ranging from 1-12 microns on a side were fabricated.

Silicon ions were implanted into these regions of the insulative layers again using an ion implantation machine (e.g., the Extrion 200-20 ion implanter manufactured by Varion, Inc. of Gloucester, Mass. or equivalent).

Following masking removal, an 8000 angstrom thick upper conductor of an Al-Si-Cu alloy was sputter deposited again on top, photolithographically patterned and etched to provide a second layer of upper conductive lines traversing the implantation regions.

These structures were then selectively exposed to laser radiation from an argon laser focused into a 1.3 micron diameter beam. The irradiated implantation sites again were found to exhibit excellent conductivity. In all instances the interlayer conductive paths were well bonded to the upper and lower conductive metal lines. Analysis of vertical paths and the metal lines again revealed solid interdiffusion and alloy of silicon into the upper and lower conductors as well as diffusion aluminum into the link region.

SiO, implanted at $8.0 \times 10^{17}$ and $1.5 \times 10^{18}$ was laser linked with 1 millisecond pulses at 1.5 watts to produce resistances on the order of 10 to 20 ohms. If the Si implant is reduced to $4 \times 10^{17}$, the laser power should be increased to 2.25 watts to produce equally low resistance links. Si implants below $2 \times 10^{17}$ did not result in good laser links. With PI implanted at $2 \times 10^{18}$, laser links were produced at 1.4 watts, resulting in 10-20 ohm link resistance. The polyimide would not link at lower Si implants. Silicon implanted SiN laser links were also achieved at powers ranging from about 1 to 2 watts.

In some instances, the laser activation of the programmable links is preferably carried out by a series of short pulses, for example, 60 pulses of 80 microseconds each, using an argon laser at 1.5 watts. This procedure has the advantage of reducing the laser power required to form the link and typically achieves a more uniform result.

We claim:

1. A method for selectively activating interlayer conductive paths in an integrated circuit structure, the method comprising the steps of:
    depositing an insulative layer upon a lower element of an integrated circuit structure;
    implanting ions into at least one region of the insulative layer;
    depositing an upper layer of conductive material over the implant region of the insulative layer; and
    selectively applying energy to at least one of said implant regions of said integrated circuit structure to locally diffuse material from the upper conductive layer into the selected region of the insulative layer, thereby forming a discrete conductive path in the selected region between the upper conductive layer and the lower element.

2. The method of claim 1 wherein the step of depositing an insulative layer further includes depositing a material selected from the group consisting of silicon dioxide, silicon nitride, silicon carbide, aluminum oxide, polyimide and diamond-structure carbon.

3. The method of claim 1 wherein the step of depositing an insulative layer further includes depositing a silicon dioxide layer and the step of implanting ions further includes implanting silicon ions into the selected regions of the silicon dioxide layer.

4. The method of claim 1 wherein the step of depositing an insulative layer further includes depositing a layer of silicon nitride, and the step of implanting ions further includes implanting silicon ions into the selected regions of the silicon nitride layer.

5. The method of claim 4 wherein the step of depositing an insulative layer further includes depositing a layer of polyimide and the step of implanting ions further includes implanting silicon ions into selected regions of the polyimide layer.

6. The method of claim 1 wherein the step of depositing an insulative layer further includes plasma enhanced chemical vapor deposition of the insulative layer.

7. The method of claim 1 wherein the step of implanting ions into the selected region of the insulated layer further includes masking the insulative layer so as to expose only the selected region.

8. The method of claim 1 wherein the implanting step comprises photo-lithographically patterning a resist on said insulative layer, etching the resist to create the selected exposed regions, and removing the resist after implanting said ions into the selected region.

9. The method of claim 1 wherein the step of implanting ions further includes controlling a narrow beam of ions to provide direct maskless ion implantation into the selected region.

10. The method of claim 1 wherein the step of implanting ions further includes implanting ions selected from the group consisting of silicon, germanium, carbon, boron, arsenic, phosphorous, titanium, molybdenum, aluminum, beryllium and gold.

11. The method of claim 1 wherein the step of implanting ions further includes implanting ions at a dose ranging from about $1.0 \times 10^{16}/cm^2$ to about $1.0 \times 10^{19}/cm^2$.

12. The method of claim 1 wherein the step of depositing an upper conductive layer further includes depositing a material selected from a group consisting of alloys of aluminum, gold and platinum.

13. The method of claim 1 wherein the step of depositing the upper conductive layer further includes sputtering a conductive metal alloy onto the insulative layer and patterning said upper conductive layer to form at least one conductive metal line as the upper layer.

14. The method of claim 1 wherein the diffusion step is performed by selective application of electrical energy.

15. The method of claim 1 wherein the diffusion step is performed by selective exposure to directed electromagnetic radiation.

16. The method of claim 1 wherein the resulting interlayer conductive path in the selected region is characterized by a resistivity of less than about $10^{-3}$ ohm-cm.

17. The method of claim 1 wherein the lower element is a lower conductive layer.

18. The method of claim 1 wherein the lower element is a semiconductive element.

19. The method of claim 1 wherein the method further includes the steps of substantially evacuating a chamber and performing the implantation step in the substantially evacuated chamber.

20. A method of selectively activating an interlayer conductive path in a multilayer integrated circuit comprising the steps of forming a first layer and a second, generally insulative, layer thereon; implanting silicon atoms into at least one region of the insulative layer; forming a third layer on at least a portion of the insulative layer overlying the implant region, wherein one of said first or third layers is made of a conductive material, selectively applying sufficient energy to the selected implant region to convert the selected implant region into a generally conductive composite material and thereby locally forming a discrete conductive path through the second layer, said path vertically interconnecting the first and third layers.

21. A method of selectively activating a link for interconnecting multi-level integrated circuit conductors, including the steps of:
 plasma depositing an interlayer material essentially consisting of a generally insulative silicon compound directly on a lower layer essentially of a generally conductive aluminum alloy;
 implanting silicon atoms into the interlayer material through a mask having at least one opening at a selected via site;
 depositing an upper layer essentially consisting of aluminum alloy directly over said implanted via sites; and
 locally diffusing aluminum from said upper and lower layers into the implanted via site of the interlayer material, and thereby producing a discrete low resistance interconnection between the upper and lower layers.

22. The method of claim 21 wherein the step of implanting ions further includes implanting ions at a dose ranging from about $1.0 \times 10^{16}/cm^2$ to about $1.0 \times 10^{19}/cm^2$.

23. The method of claim 21 wherein the diffusion step further includes selective application of electrical energy.

24. The method of claim 20 wherein the diffusion step further includes selective application of directed electromagnetic radiation.

25. The method of claim 21 wherein the step of implanting ions further includes implanting ions at multiple implantation energies.

* * * * *